United States Patent
Shim et al.

(10) Patent No.: US 8,680,539 B2
(45) Date of Patent: Mar. 25, 2014

(54) FOLDABLE ORGANIC LIGHT EMITTING DIODE DISPLAY

(75) Inventors: Hong-shik Shim, Seoul (KR); In-seo Kee, Seongnam-si (KR); Sang-yoon Lee, Seoul (KR)

(73) Assignees: Samsung Electronics Co., Ltd. (KR); Samsung Display Co., Ltd. (KR)

( * ) Notice: Subject to any disclaimer, the term of this patent is extended or adjusted under 35 U.S.C. 154(b) by 126 days.

(21) Appl. No.: 13/304,952

(22) Filed: Nov. 28, 2011

(65) Prior Publication Data

US 2012/0138970 A1 Jun. 7, 2012

(30) Foreign Application Priority Data

Dec. 7, 2010 (KR) ......................... 10-2010-0124439

(51) Int. Cl.
*H01L 27/32* (2006.01)
*H01L 51/56* (2006.01)

(52) U.S. Cl.
USPC 257/77; 257/40; 257/E27.119; 257/E51.018; 438/28

(58) Field of Classification Search
USPC .......... 257/88, 40, E27.119, E51.018; 438/28
See application file for complete search history.

(56) References Cited

U.S. PATENT DOCUMENTS

| 2009/0072226 A1* | 3/2009 | Koo et al. ......................... 257/40 |
| 2010/0201603 A1* | 8/2010 | Kee et al. ......................... 345/1.3 |

FOREIGN PATENT DOCUMENTS

| JP | 2009-162999 A | 7/2009 |
| KR | 10-2000-0075223 A | 12/2000 |
| KR | 10-2002-0022216 A | 3/2002 |
| KR | 10-2008-0079089 A | 8/2008 |
| KR | 10-2010-0092220 A | 8/2010 |

* cited by examiner

*Primary Examiner* — Whitney T Moore
(74) *Attorney, Agent, or Firm* — Cantor Colburn LLP

(57) ABSTRACT

A foldable display includes a first plate, a second plate, a first protecting window, a second protecting window, a soft material layer and an intermediate layer which controls brightness. The first plate includes a thin film transistor and an organic light emitting diode ("OLED"), and displays at least one portion of an image to be displayed. The second plate includes a thin film transistor and an OLED, and displays a second portion different from the first portion of the image. The first protecting window is on the first plate. The second protecting window is on the second plate. The soft material layer is between the first and second protecting windows. The intermediate layer is between the soft material layer and a side surface of the first protecting window, and between the soft material layer and the second protecting window.

13 Claims, 2 Drawing Sheets

FOLDABLE ORGANIC LIGHT EMITTING DIODE DISPLAY

CROSS-REFERENCE TO RELATED APPLICATIONS

This application claims priority to Korean Patent Application No. 10-2010-0124439, filed on Dec. 7, 2010, and all the benefits accruing therefrom under 35 U.S.C. §119, the disclosure of which is incorporated herein in its entirety by reference.

BACKGROUND

1. Field

Provided is a display, and more particularly, a foldable display using an organic light emitting diode ("OLED").

2. Description of the Related Art

Foldable displays are relatively small in overall dimensional area compared to a dimensional area necessary for forming large screen. Therefore, it is expected that the foldable displays will be widely used for portable electronic devices. The foldable displays include a protecting window for protecting a screen region against an external impact. The protecting window is required to be foldable, but commonly includes a hard material. Accordingly, materials softer than that of the hard material of the common protecting window are used in the folded portions of the foldable displays.

Due to the refractive index difference between the hard material and the soft material, light traveling from the hard material to the soft material may be totally reflected at the boundary between the hard material and the soft material. Therefore, an image that is shown through protecting windows at opposing sides of the folded portion having the soft material, may be disconnected in the folded portion.

SUMMARY

Provided is a foldable display which can remove image disconnection in a specific portion of a screen.

Additional aspects will be set forth in part in the description which follows and, in part, will be apparent from the description, or may be learned by practice of the presented embodiments.

Provided is a foldable organic light emitting display including a first plate including a thin film transistor and an organic light emitting diode ("OLED"), the first plate displaying at least one portion of an image to be displayed; a second plate including a thin film transistor and an OLED, the second plate displaying a second portion different from the first portion of the image; a first protecting window on the first plate; a second protecting window on the second plate; a soft material layer between the first and second protecting windows; and an intermediate layer between the soft material layer and side surfaces of the first and second protecting windows, respectively, the intermediate layer controlling brightness.

The intermediate layer may decrease a reflection rate of light which is incident on the side surfaces of the first and second protecting windows through bottoms of the first and second protecting windows.

The intermediate layer may increase a total reflection angle of light which is incident on the side surfaces of the first and second protecting windows through bottoms of the first and second protecting windows.

A refractive index of the intermediate layer may be between a refractive index of the first protecting window and a refractive index of the soft material layer, and between a refractive index of the second protecting window and the refractive index of the soft material layer.

A thickness of the intermediate layer may be about 3 micrometers (μm) to about 10 μm in a direction parallel to the first and second protecting windows.

A refractive index of the intermediate layer may progressively decrease in a direction from the first protecting window to the soft material layer, and from the second protecting window to the soft material layer.

The intermediate layer may be a single layer or a multi-layer in a direction parallel to the first and second protecting windows.

When the intermediate layer is the multi-layer, a refractive index of the multi-layer may progressively decrease in a direction from the first protecting window to the soft material layer, and from the second protecting window to the soft material layer.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
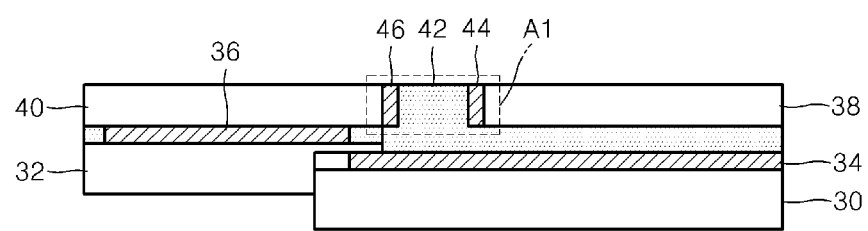
FIG. 1 illustrates a cross-sectional view of a foldable display according to an embodiment of the present invention, and is a cross-sectional view of the foldable display in an unfolded state where display surfaces are fully exposed.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, the invention will be described in detail with reference to the accompanying drawings.

Hereinafter, a foldable display according to an embodiment of the present invention will be described below in more detail with reference to the accompanying drawings. In the figures, the dimensions of layers and regions may be exaggerated for clarity of illustration.

In a foldable display, a hard material protecting window overlaps each display area of a plurality of display devices, and a soft material member is between adjacent protecting windows and in a folding portion of the foldable display. The hard material and the soft material member collectively form a protecting window layer which is foldable at the folding portion of the foldable display.

Referring to FIG. 1, a foldable display according to an embodiment of the present invention includes first and second plates 30 and 32. The first and second plates 30 and 32 may be transparent to light. The first and second plates 30 and 32 include a plurality of thin film transistors and organic light emitting diodes ("OLEDs") that configure an array. In a state where the display is unfolded, the first and second plates 30 and 32 are horizontally arranged in parallel, and the first plate 30 partially overlaps with the second plate 32 in a portion where the first plate 30 contacts the second plate 32.

The first plate 30 includes a first region 34 for displaying a first image, and the second plate 32 includes a second region 36 for displaying a second image. The first and second images collective form an entire image displayed by the foldable display. In the state where the display is unfolded, the first and second regions 34 and 36 may configure a horizontally continuous screen. In FIG. 1, a left end of the first region 34 and a right end of the second region 36 may be disposed on the same vertical line, that is, may be aligned with each other.

Most portions of the first region 34 are covered (e.g., overlapped) by a first protecting window 38. The first protecting window 38 may include a light-transmitting hard material. In one embodiment, for example, the first protecting window may be a glass substrate having a refractive index of about 1.51. The first protecting window 38 is parallel to and separated from the first region 34.

A portion of the first region 34 that is not covered by the first protecting window 38 is covered by a material layer 42 which is softer than the hard material of the first protecting window 38. The soft material layer 42 may be a material layer that includes a light-transmitting material and has a refractive index lower than that of the first protecting window 38. In one embodiment, for example, the soft material layer 42 may be a silicon layer. The soft material layer 42 completely fills a gap between the first plate 30 and the first protecting window 38. An outer surface of the soft material layer 42 and an outer surface of the first plate 38 are coplanar. The portion of the soft material 42 between the protecting windows 38 and 40, and the portion between the first region 34 and the second protecting window 38 may collectively form a single, unitary, indivisible member.

A first intermediate layer 44 is between a side surface of the first protecting window 38 and the soft material layer 42. The side surface of the first protecting window 38 is covered (e.g., completely overlapped) by the first intermediate layer 44. A thickness of the first intermediate layer 44 taken perpendicular to the side surface of the first protecting window 38 (e.g., in the horizontal direction) may be more than about 100 nanometers (nm). In one embodiment, the thickness of the first intermediate layer may be, for example, about 100 nm to about 10 micrometers (μm), about 100 nm to about 30 μm, or about 3 μm to about 10 μm. The first intermediate layer 44 is a light-transmitting material layer. The refractive index of the first intermediate layer 44 is between the refractive index of the first protecting window 38 and the refractive index of the soft material layer 42. In one embodiment, for example, when the refractive index of the first protecting window 38 is about 1.51 and the refractive index of the soft material layer 42 is about 1.41, the refractive index of the first intermediate layer 44 may be about 1.48. Since the refractive index of the first intermediate layer 44 is between the refractive index of the first protecting window 38 and the refractive index of the soft material layer 42, a total reflection angle for light, which is incident on the side surface of the first protecting window 38 through a bottom of the first protecting window 38 from the first region 34 under the first protecting window 38, is larger than a case where the first intermediate layer 44 is not included. Thus, a ratio of light totally reflected from the light incident on the side surface of the first protecting window 38 is significantly smaller than a case where the first intermediate layer 44 is not included. In other words, when the first intermediate layer 44 is included, most of light which is incident on the side surface of the first protecting window 38 through the bottom of the first protecting window 38 may travel in the same direction as that of light that is incident on the side surface through the side surface.

The second region 36 of the second plate 32 is entirely covered by the second protecting window 40. The second protecting window 40 may include the same material as that of the first protecting window 38, and have the same thickness as that of the first protecting window 38 taken in a direction perpendicular to the first and second plates 30 and 32. The first and second protecting windows 38 and 40 are separated from each other, and a gap between the first and second protecting windows 38 and 40 is completely filled by the soft material layer 42.

A second intermediate layer 46 is between the side surface of the second protecting window 40 and the soft material layer 42. A side surface of the second protecting window 40 is covered (e.g., completely overlapped) by the second intermediate layer 46. A thickness and material of the second intermediate layer 46 may be the same as those of the first intermediate layer 44, respectively. Since the refractive index of the second intermediate layer 46 is between the refractive index of the second protecting window 40 and the refractive index of the soft material layer 42, like the first protecting window 38, the total reflection rate of light which is incident on the side surface of the second protecting window 40 through a bottom of the second protecting window 40 is further reduced than a case where the second intermediate layer 46 is not included.

As a result, when the first and second intermediate layers 44 and 46 are included, the side portion of each of the first and second protecting windows 38 and 40, e.g., a boundary portion between each of the protecting windows 38 and 40, and the soft material layer 42, respectively, is viewed from the front of the protecting windows 38 and 40, an increase in brightness of the boundary portion to greater than that of another portion of the each protecting window in a continuous screen, or the degree where the brightness of the boundary portion increases, can be reduced or effectively prevented. Also, when a side portion of one of the protecting windows is viewed from the front of the other protecting window, for example, the side portion of the second protecting window 40 is viewed from the front of the first protecting window 38, a decrease of brightness of the side portion to less than that of another portion of the each protecting window, or the degree where the brightness of the side portion decreases can be reduced or effectively prevented. As a result, the first and second intermediate layers 44 and 46 are included, and thus an image displayed on the display can become a complete image without disconnection of any one portion thereof.

Considering the above-described functions, the first and second intermediate layers 44 and 46 may be referred to as material layers that decrease the reflection rate of light which is incident on the side surfaces of the first and second protecting windows 38 and 40 through the respective bottoms thereof. Alternatively, the first and second intermediate layers 44 and 46 may be referred to as material layers that increase the total reflection angle of light which is incident on the side surfaces of the first and second protecting windows 38 and 40 through the respective bottoms thereof.

Figure 2:
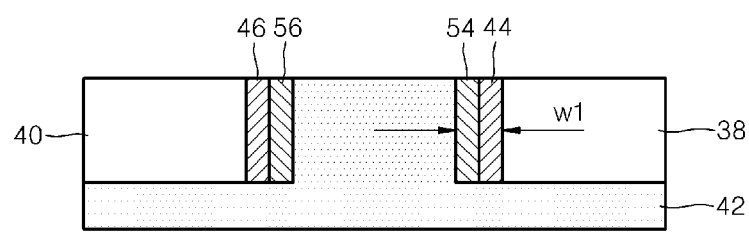
FIG. 2 is a cross-sectional view of an enlarged portion A1 of FIG. 1.

FIG. 2 illustrates an enlarged region A1 which includes the first and second intermediate layers 44 and 46, and the soft material layer 42 therebetween in FIG. 1.

As illustrated in FIG. 2, a third intermediate layer 54 may be further between the first intermediate layer 44 and the soft material layer 42. The third intermediate layer 54 may be a light-transmitting material layer. The refractive index of the third intermediate layer 54 may be between the refractive index of the first intermediate layer 44 and the refractive index of the soft material layer 42. The thickness of the third intermediate layer 54 may be the same as or different from that of the first intermediate layer 44. The total thicknesses w1 of the first and third intermediate layers 44 and 54 may be more than about 100 nm. In one embodiment, for example, the thickness w1 may be about 100 nm to about 10 μm or about 100 nm to about 30 μm. A fourth intermediate layer 56 may be further between the second intermediate layer 46 and the soft material layer 42. All structural features of the fourth intermediate layer 56 may be the same as those of the third intermediate layer 54.

Another intermediate layer may be further between each of the third and fourth intermediate layers 54 and 56, and the soft material layer 42, respectively. In this case, the refractive index of this another intermediate layer may be between the refractive index of each of the third and fourth intermediate layers 54 and 56, and the refractive index of the soft material layer 42, respectively. Between each of the first and second protecting windows 38 and 40 and the soft material layer 42, therefore, a light-transmitting material layer having a refractive index less than the refractive index of each of the first and second protecting windows 38 and 40, and greater than the refractive index of the soft material layer 42, may be included in a single layer or a multi-layer. In this case, the refractive index of the multi-layer progressively decreases in a direction from the protecting windows 38 and 40, to the soft material layer 42, respectively. Moreover, for example, by making an impurity-doping concentration different using an impurity-doping method, the refractive index of the single layer or the refractive index of the multi-layer may be continuously changed.

In an embodiment of forming the foldable display, the first and second protecting windows 38 and 40 are stacked such that the side surfaces of the first and second protecting windows 38 and 40 upon which the intermediate layers 44, 46, 54 and 56 are formed, are oriented in the same direction in a process of preparing the first and second protecting windows 38 and 40, and then the first to fourth intermediate layers 44, 46, 54 and 56 may be formed by depositing the intermediate layers 44, 46, 54 and 56 on the side surfaces of the first and second protecting windows 38 and 40, respectively.

Figure 3:
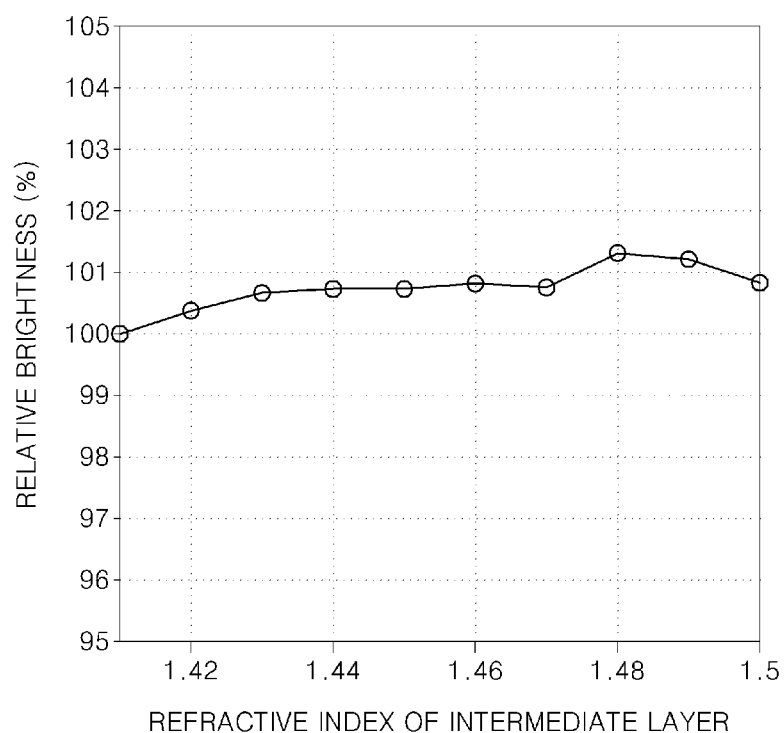
FIG. 3 is a graph showing brightness change of light which is emitted through a side surface of a protecting window, based on a refractive index of an intermediate layer between the protecting window and a soft material layer, in a foldable display according to an embodiment of the present invention.

FIG. 3 shows change of brightness in the side surfaces of the protecting windows 38 and 40, based on the refractive indexes of the intermediate layers 44 and 54 which are included on the side surfaces of the protecting windows 38 and 40, respectively. That is, when the intermediate layers 44 and 54 are included, FIG. 3 shows change in the amount of light that is emitted through the side surfaces of the protecting windows 38 and 40.

Since light transmission is directly associated with light reflection in the side surfaces of the protecting windows 38 and 40, the result of FIG. 3 notifies information on the change of a light reflection rate in the side surfaces of the protecting windows 38 and 40 when the intermediate layers 44 and 54 exist on the side surfaces of the protecting windows 38 and 40, In FIG. 3, the abscissa axis indicates the refractive indexes of the intermediate layers 44 and 54, and the ordinate axis indicates change in the amount of light that is emitted to the side surfaces through the bottoms of the protecting windows 38 and 40, as a relative brightness (%). For convenience, it is assumed that brightness of light which is emitted through the side surfaces of the protecting windows 38 and 40 is 100% at the start point of the abscissa axis (where a refractive index of 1.41). Since the refractive index of 1.41 is a refractive index when the soft material layer 42 includes silicon, brightness at the start point of the abscissa axis denotes brightness of light emitted through the side surfaces of the protecting windows 38 and 40 when any intermediate layer does not exist.

Referring to FIG. 3, it can be seen that the refractive indexes of the intermediate layers 44 and 54 increase in a range less than the refractive indexes (e.g., 1.51) of the protecting windows 38 and 40, and also relative brightness increases. Through the result of FIG. 3, it can be seen that the first and second intermediate layers 44 and 46 and/or the first to fourth intermediate layers 44, 46, 54 and 56 are included between the protecting windows 38 and 40 and the soft material layer 42, respectively, and thus brightness increases through the side surfaces of the protecting windows 38 and 40. In the foldable display according to an embodiment of the present invention, a relatively dark region (e.g., a dark line) that may be shown at a viewing angle facing the side surface of the other protecting window (for example, the first protecting window 38) may be removed or brightness of the dark line may increase, at a position deviating from any one protecting window (for example, the first protecting window 38), e.g., at the front of the second protecting window 40.

Through the result of FIG. 3, it can be seen that a light reflection rate decreases in the side surfaces of the protecting windows 38 and 40 when the intermediate layer 42 exists. In the foldable display according to an embodiment of the present invention, therefore, a relatively bright region (e.g., a bright line) that may be shown at a viewing angle facing the side surface of the other protecting window, for example, the first protecting window 38, may be removed or brightness of the bright line may decrease, at the front of any one protecting window, for example, the second protecting window 40. Accordingly, disconnection can be removed in an image displayed on the display.

It should be understood that the embodiments described herein should be considered in a descriptive sense only and not for purposes of limitation. Descriptions of features or aspects within each embodiment should typically be considered as available for other similar features or aspects in other embodiments.

What is claimed is:

1. A foldable organic light emitting display comprising:
   a first plate comprising a thin film transistor and an organic light emitting diode, wherein the first plate displays at least one portion of an image;
   a second plate comprising a thin film transistor and an organic light emitting diode, wherein the second plate displays a second portion different from the first portion of the image;
   a first protecting window on the first plate;
   a second protecting window on the second plate;
   a soft material layer between the first and second protecting windows; and
   an intermediate layer between the soft material layer and a side surface of the first protecting window, and between the soft material layer and the second protecting window,
   wherein
   the intermediate layer controls brightness, and
   the first protecting window, the second protecting window, a partial region of the soft material layer and the intermediate layer are horizontally arranged in parallel, in a state where the foldable organic light emitting display is unfolded.

2. The foldable organic light emitting display of claim 1, wherein the intermediate layer decreases a reflection rate of light which is incident on the side surfaces of the first and second protecting windows through bottoms of the first and second protecting windows, respectively.

3. The foldable organic light emitting display of claim 1, wherein the intermediate layer increases a total reflection angle of light which is incident on the side surfaces of the first and second protecting windows through bottoms of the first and second protecting windows, respectively.

4. The foldable organic light emitting display of claim 1, wherein a refractive index of the intermediate layer is between a refractive index of the first protecting window and a refractive index of the soft material layer, and between a refractive index of the second protecting window and the refractive index of the soft material layer.

5. The foldable organic light emitting display of claim 1, wherein a thickness of the intermediate layer is about 3 micrometers to about 10 micrometers in a direction parallel to the first and second protecting windows.

6. The foldable organic light emitting display of claim 1, wherein a refractive index of the intermediate layer progressively decreases in a direction from the first protecting window to the soft material layer, and from the second protecting window to the soft material layer.

7. The foldable organic light emitting display of claim 4, wherein the intermediate layer is a single layer or a multi-layer in a direction parallel to the first and second protecting windows.

8. The foldable organic light emitting display of claim 7, wherein the intermediate layer is the multi-layer, and a refractive index of the multi-layer progressively decreases in a direction from the first protecting window to the soft material layer, and from the second protecting window to the soft material layer.

9. The foldable organic light emitting display of claim 1, wherein the soft material layer is in a folding portion of the foldable organic light emitting display.

10. The foldable organic light emitting display of claim 1, further comprising a first display region on the first plate and a second display region on the second plate;
    wherein the soft material layer is further between the second display region and the second protecting window.

11. A method of forming a foldable organic light emitting display, the method comprising:
    disposing a first protecting layer on a first display region of a first display device;
    disposing a second protecting layer on a second display region of a second display device, and spaced apart from the first protecting layer;
    disposing a third protecting layer between the first and second protecting layers, in a folding region of the foldable organic light emitting display; and
    disposing an intermediate layer between the first protecting layer and the third protecting layer, and between the second protecting layer and the third protecting layer,
    wherein
    a refractive index of the intermediate layer is
       between refractive indices of the first protecting layer and the third protecting layer, and
       between refractive indices of the second protecting layer and the third protecting layer, and
    the first protecting window, the second protecting window, a partial region of the soft material layer and the intermediate layer are horizontally arranged in parallel, in a state where the foldable organic light emitting display is unfolded.

12. The method of forming a foldable organic light emitting display of claim 11, wherein a material of the third protecting layer is softer than materials of the first and second protecting layers.

13. The method of forming a foldable organic light emitting display of claim 12, wherein
    the intermediate layer is a multi-layer structure, and
    a refractive index of the multi-layer structure progressively decreases in a direction from the first protecting layer to the third protecting layer, and from the second protecting layer to the third protecting layer.

* * * * *